United States Patent
Nickhou et al.

(10) Patent No.: US 6,866,051 B1
(45) Date of Patent: Mar. 15, 2005

(54) MEGASONIC SUBSTRATE PROCESSING MODULE

(75) Inventors: Afshin Nickhou, Campbell, CA (US); Randolph E. Treur, San Luis Obispo, CA (US); Michael Ravkin, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 162 days.

(21) Appl. No.: 10/259,023

(22) Filed: Sep. 26, 2002

(51) Int. Cl.$^7$ ................................................. B08B 3/12
(52) U.S. Cl. .................. 134/200; 134/186; 134/137; 134/140; 134/143; 134/902
(58) Field of Search ................ 134/137, 140, 134/143, 184, 186, 200, 902, 1.3; 438/906

(56) References Cited

U.S. PATENT DOCUMENTS

| | | | | |
|---|---|---|---|---|
| 3,007,478 A | * | 11/1961 | Leonhardt et al. | 134/57 R |
| 3,445,092 A | * | 5/1969 | Melville, Jr. et al. | 366/118 |
| 4,870,982 A | * | 10/1989 | Liu | 134/135 |
| 5,377,709 A | * | 1/1995 | Shibano | 134/184 |
| 5,447,171 A | * | 9/1995 | Shibano | 134/102.2 |
| 6,119,367 A | * | 9/2000 | Kamikawa et al. | 34/401 |
| 6,269,511 B1 | * | 8/2001 | Andreas et al. | 15/77 |
| 2001/0013355 A1 | * | 8/2001 | Busnaina | 134/1.3 |
| 2004/0016442 A1 | * | 1/2004 | Cawlfield | 134/1.3 |

FOREIGN PATENT DOCUMENTS

| | | | |
|---|---|---|---|
| JP | 62281431 | * | 12/1987 |
| JP | 10128256 | * | 5/1998 |

* cited by examiner

Primary Examiner—M. Kornakov
(74) Attorney, Agent, or Firm—Martine Penilla & Gencarella, LLP

(57) ABSTRACT

A megasonic module for substrate processing is provided. Embodiments of the present invention include a tank configured to hold processing fluids in which the substrate is submerged, and a lid configured to mate with and seal the tank. At least two megasonic transducers are positioned within the megasonic module to direct megasonic energy to each of an active surface and a backside surface of the substrate. A pair of drive wheels are configured to receive an edge of the substrate to support and rotate the substrate in a horizontal orientation between the at least two megasonic transducers. The substrate is supported against the pair of drive wheels by a substrate stabilizing arm/wheel which also allows the rotation of the substrate. A drive motor is configured to rotate the pair of drive wheels, and a fluid recirculation system provides for temperature control and use of a plurality of processing fluids.

8 Claims, 14 Drawing Sheets

MEGASONIC SUBSTRATE PROCESSING MODULE

BACKGROUND OF THE INVENTION

1. Field of the Invention

The present invention relates generally to substrate cleaning and, more particularly, to methods and apparatus for megasonic cleaning of substrates.

2. Description of the Related Art

Megasonics is a highly advanced, non-contact, cleaning technology used for small-particle-sensitive substrates such as semiconductor wafers in various states of fabrication, flat panel displays, micro-electro-mechanical systems (MEMS), micro-opto-electro-chemical systems (MOEMS), and the like. Megasonic processing typically involves the propagation of acoustic energy through a liquid medium to remove particles from, and clean, a surface of a substrate. The acoustic energy is typically propagated in a frequency range of approximately 0.4 Megahertz (MHz) to 1.5 MHz, inclusive, with "megasonic" typically defined as greater than 0.7 MHz. The liquid medium can be deionized water or any of a plurality of substrate cleaning chemicals. The propagation of acoustic energy through a liquid medium achieves non-contact substrate cleaning chiefly through pulsating bubbles and/or cavitation, microstreaming, electrical field effects, and chemical reactions enhancement when chemicals are used as the liquid medium.

FIG. 1A is a diagram of a batch substrate megasonic cleaning system 10. Tank 11 is filled with a cleaning solution 16 of deionized water or other substrate cleaning chemicals as desired. A substrate carrier 12, typically a cassette of substrates, includes a batch of substrates 14 to be cleaned. Transducer 18 generates the acoustic energy that is propagated through the cleaning solution 16. The megasonic energy, with or without appropriate chemistry to control particle re-adhesion, achieves substrate cleaning through pulsating bubbles and/or cavitation, microstreaming, electrical field effects, and chemical reactions enhancement if chemicals are used. Batch substrate megasonic cleaning tends to require lengthy processing times, and also can consume excessive volumes of chemicals. Additionally, consistency and wafer-to-wafer control are difficult to achieve. Such conditions as "shadowing" and "hot spots" are common in batch, and other, substrate megasonic processing. Shadowing occurs due to reflection and/or constructive interference of megasonic energy, and is compounded with the additional substrate surface area of multiple substrates. The occurrence of hot spots, primarily the result of constructive interference in addition to reflection, can also increase with additional multiple-substrate surface areas. One solution to these drawbacks of batch substrate megasonic processing has been the use of increased or higher megasonic energy as well as multiple transducer arrays. Also, a single substrate megasonic cleaning system evolved in response to these and other concerns.

FIG. 1B is a diagram of a single substrate megasonic cleaning system 20. The single substrate megasonic cleaning system 20 includes a tank 22 filled with a cleaning solution 28 of deionized water or substrate cleaning chemicals according to desired processing. A single substrate 24 is submerged in the cleaning solution 28 of tank 22. Transducer 26 generates the acoustic energy that is propagated through the cleaning solution 28. As in the batch substrate processing system, the megasonic energy, with or without appropriate chemistry to control particle re-adhesion, achieves substrate cleaning through pulsating bubbles and/or cavitation, microstreaming, electrical field effects, and chemical reactions enhancement if chemicals are used. A drawback of the single substrate megasonic cleaning system 20 results from the significantly smaller size of the tank 22. Effective substrate processing removes particles that remain inside the tank 22 requiring that the cleaning fluid 28 be replaced or recirculated and filtered regularly.

FIG. 1C is a diagram of single substrate, nozzle-type megasonic cleaning system 30. Nozzle 31, coupled with transducer 38, supplies a fluid stream 34 to the surface of a substrate 32 forming a meniscus 36. Transducer 38, generates the acoustic energy 40 that travels with the fluid stream 34 and is propagated through the meniscus 36 to the surface of substrate 32 as the fluid stream 34 flows through the nozzle 31 maintaining the meniscus 36. Megasonic energy 40 propagating through meniscus 36 effects substrate 32 cleaning. Additionally, substrate 32 is rotated to achieve uniform cleaning of an entire surface of substrate 32. In FIG. 1C, directional arrow 42 indicates substrate 32 rotation.

FIG. 1D shows another single substrate cleaning system 50 in which a meniscus 36 is formed and maintained on the surface of a substrate 32 by a fluid stream 34 delivered by any of a plurality of supply methods. A local area transducer 38 generates acoustic energy 40 that is propagated through the meniscus 36 to the surface of the substrate. Substrate 32 is rotated 42 to achieve uniform cleaning of an entire surface of substrate 32.

Either single substrate megasonic cleaning system illustrated in FIGS. 1C and 1D is limited to a single surface megasonic cleaning process at a time, and in particular, the single substrate cleaning system 50 illustrated in FIG. 1D requires a high fluid flow and fluid volume to maintain the meniscus 36 and the necessary fluid medium contact between transducer 38 and substrate 32. Additionally, a fairly high megasonic energy is needed to clean the substrate 32, which in turn, may cause damage to the surface of the substrate 32. The high energy required also necessitates cooling of the transducer 38, typically increasing the fluid flow and volume requirements. Due to cost and effluent handling requirements, substrate processing using a cleaning chemistry other than deionized water is impractical.

As is known, the cleaning chemistries for single substrate cleaning processes are typically highly reactive and often require application at elevated temperatures to provide effective cleaning at low cleaning duration, particularly for post etch cleaning applications. Each of the single substrate cleaning configurations described above use batch heating systems with chemical re-circulation, or in the case of a single substrate, nozzle-type megasonic cleaning system 30, batch heating with heated delivery lines so that the fluid temperature of the meniscus 36 is maintained to optimally clean the substrate 32 surface.

Additionally, as particle tolerance specifications continue to become more and more stringent, it becomes increasingly desirable, if not necessary, to perform megasonic processing on both the active and back-side surfaces of a substrate.

In view of the foregoing, there is a need for a method and apparatus to provide a single substrate megasonic processing configuration that is capable of providing consistent, controllable, and effective megasonic processing. Methods and apparatus for single substrate megasonic processing should be configured to meet or exceed particulate requirements, and should be easily configurable to existing substrate processing systems.

SUMMARY OF THE INVENTION

Broadly speaking, the present invention fills these needs by providing a single-substrate, dual-sided, megasonic processing module. Embodiments of the present invention include a megasonic processing module having megasonic transducers directing megasonic energy at both the active and the back side surfaces of a substrate that is immersed in processing fluids and rotated during processing. The present invention can be implemented in numerous ways, including as a process, an apparatus, a system, a device, or a method. Several embodiments of the present invention are described below.

In one embodiment, a megasonic module for substrate processing is disclosed. The megasonic module includes a tank configured to hold processing fluids in which the substrate is submerged, and a lid configured to mate with and seal the tank. At least two megasonic transducers are positioned within the megasonic module to direct megasonic energy to each of an active surface and a backside surface of the substrate.

In another embodiment, a megasonic substrate processing tool is disclosed. The megasonic substrate processing tool includes an immersion tank and an immersion tank lid configured to mate with and seal the immersion tank. A first megasonic transducer is positioned within the immersion tank, and a second megasonic transducer is positioned on the immersion tank lid. At least one substrate drive wheel is included and configured to support a substrate within the immersion tank between the first megasonic transducer and the second megasonic transducer for simultaneous megasonic processing of an active surface and a backside surface of the substrate.

In still a further embodiment, an integrated substrate processing system having clustered substrate processing tools is disclosed. The integrated substrate processing system includes a chemical mechanical planarization (CMP) substrate processing tool, a single-substrate, dual-sided substrate megasonic processing tool, a substrate drying tool, and a substrate transfer system configured to transfer a substrate being processed between each of the CMP substrate processing tool, the single-substrate, dual-sided substrate megasonic processing tool, and the substrate drying tool.

In yet another embodiment, a method for megasonic processing of a substrate is disclosed. The method for megasonic processing of a substrate includes receiving a substrate in a horizontal orientation in a pair of substrate drive wheels. The substrate is secured in a horizontal orientation against the substrate drive wheels with a substrate stabilizing arm/wheel. The method further provides for submerging the substrate in processing fluids in an immersion tank. The substrate is submerged between a first megasonic transducer and a second megasonic transducer. The method then includes applying megasonic energy from the first megasonic transducer and the second megasonic transducer through the processing fluids simultaneously to both an active surface and a backside surface of the submerged substrate. The substrate is rotated during the applying of the megasonic energy.

The advantages of the present invention are numerous. One notable benefit and advantage of the invention is the simultaneous application of megasonic energy to both an active and a backside surface of a substrate. Embodiments of the present invention provide for more effective megasonic processing by processing a single substrate in a horizontal orientation with a dual-sided megasonic processing.

Another benefit is relatively low fluid volume requirements of embodiments of the present invention. The present invention provides improved megasonic processing while recirculating, recharging, and replenishing processing fluids as required and minimizing effluent requirements and waste issues.

An additional benefit is the flexibility provided by embodiments of the present invention. Configured to be easily exchanged with other processing tools in integrated processing systems, the present invention is readily capable of implementation in existing systems for enhanced performance and improved megasonic processing.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for single substrate megasonic processing is disclosed. In preferred embodiments, methods and apparatus include a single substrate megasonic processing module, and methods for dual-sided, single substrate processing. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
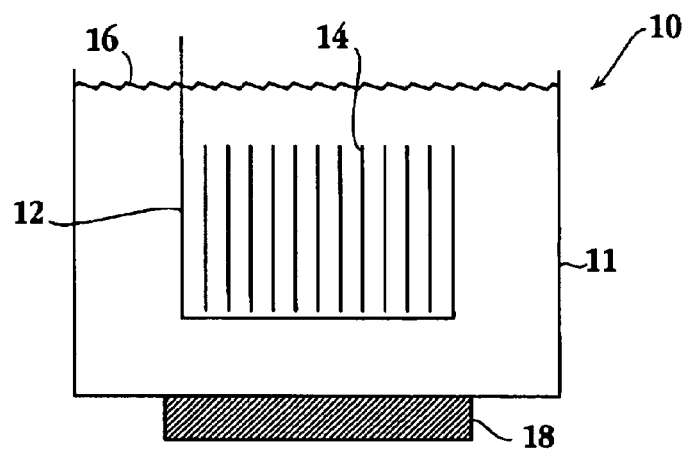
FIG. 1A is a diagram of a batch substrate megasonic cleaning system.
Figure 1B:
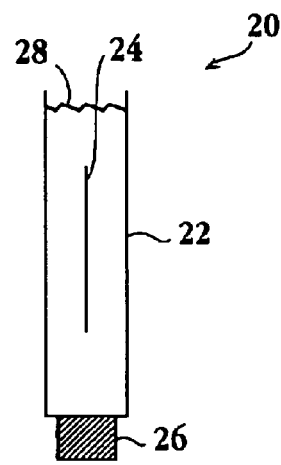
FIG. 1B is a diagram of a single substrate megasonic cleaning system.
Figure 1C:
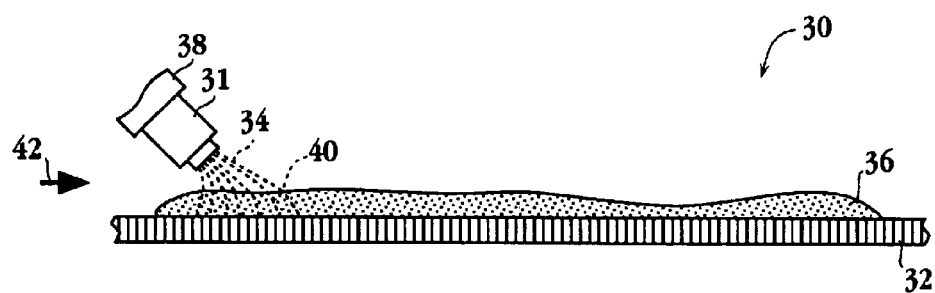
FIG. 1C is a diagram of single substrate, nozzle-type megasonic cleaning system.
Figure 1D:
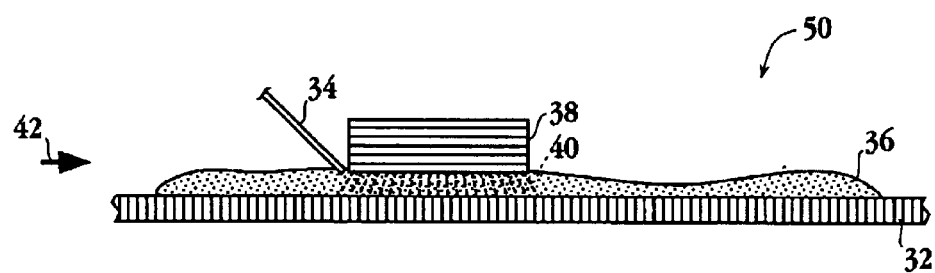
FIG. 1D shows another single substrate cleaning system.
Figure 2:
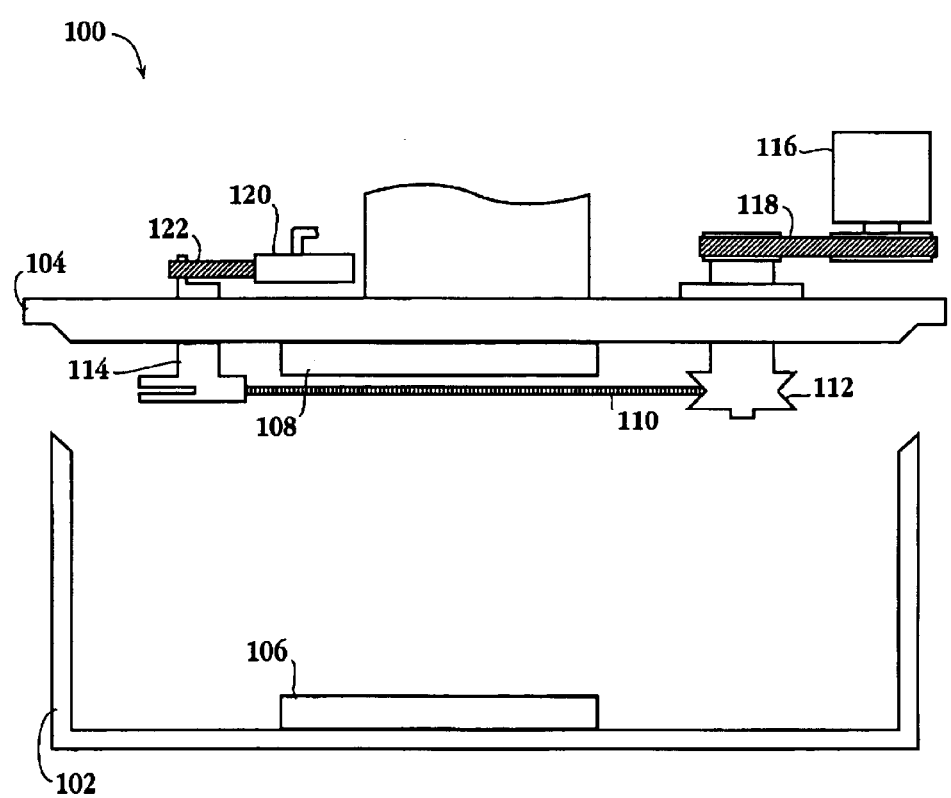
FIG. 2 is a diagram of a megasonic module in accordance with one embodiment of the present invention.

FIG. 2 is a diagram of a megasonic module 100 in accordance with one embodiment of the present invention. The megasonic module 100 includes a substrate processing tank 102 (hereinafter referred to as Tank 102), and a tank lid 104 (hereinafter referred to as Lid 104). A lid megasonic transducer 108 and a tank megasonic transducer 106 are positioned on lid 104 and in tank 102, respectively, and provide megasonic energy for simultaneously processing an active and a backside surface of a substrate 110. A substrate 110 is positioned in drive wheels 112, and secured in position with substrate stabilizing arm/wheel 114. In one embodiment, the substrate stabilizing arm/wheel 114 is positioned with an air cylinder 120 and a positioning rod 122 to open and close the stabilizing arm/wheel 114 to receive, secure, and release a substrate 110 to be processed in the megasonic module 100.

In one embodiment, substrate 110 is inserted into megasonic module 100 with, by way of example, a substrate handling robot, and the substrate 110 is oriented in a horizontal orientation. Lid 104 is separated from tank 102 providing access to drive wheels 112 and substrate stabilizing arm/wheel 114. In one embodiment, lid 104 is positioned in an open or a closed position with a pneumatic system (not shown in FIG. 2) that raises and lowers lid 104. Tank 102 remains stationary. In other embodiments, a servo motor, hydraulic, pneumatic, or any other suitable system is used to position lid 104, or to position tank 102 in any embodiment in which tank 102 is configured to move to mate with lid 104, or in which tank 102 and lid 104 are both configured to move.

Substrate stabilizing arm/wheel 114 is positioned in an open position allowing substrate 110 to be positioned against, and to be supported by drive wheels 112. When substrate 110 is in position against drive wheels 112, substrate stabilizing arm/wheel 114 is positioned against substrate 110 to secure substrate 110 in position for processing. In one embodiment, substrate stabilizing arm/wheel 114 is configured to secure and support substrate 110 in a horizontal orientation for processing, and to allow rotation of substrate 110. In other embodiments, substrate processing is performed with substrate 110 in a vertical orientation. Drive wheels 112 contact a peripheral edge of substrate 110 and, as will be described in greater detail below, rotate substrate 110 during processing. Substrate stabilizing arm/wheel 114 includes a freely spinning wheel to allow for substrate 110 rotation while supporting substrate 110 in a horizontal orientation.

In one embodiment, once substrate 110 is positioned against drive wheels 112 and secured by substrate stabilizing arm/wheel 114, and any substrate handling robot has been withdrawn, lid 104 is mated with tank 102 to close and seal the processing environment with substrate 110 positioned therein. Tank 102 is then filled with processing fluid including deionized (DI) water, or processing chemicals as desired. Once the closed megasonic module 100 is filled with desired processing fluid, and substrate 110 is immersed therein, megasonic processing of substrate 110 is accomplished by tank megasonic transducer 106 directing megasonic energy against the surface of substrate 110 facing the tank megasonic transducer 106, and by lid megasonic transducer 108 directing megasonic energy against the surface of substrate 110 facing the lid megasonic transducer 108. With substrate 110 submerged in processing chemicals, drive wheels 112 rotate substrate 110 to ensure complete and uniform processing across the entire surface of both the active and backside surfaces of substrate 110. In one embodiment, drive motor 116 is provided to drive the drive wheels 112 with drive belt 118. In other embodiments, gears, sprocket and chain, and the like are used instead of drive belt 118.

During substrate processing, processing fluids are pumped through a heater and filter (not shown in FIG. 2) and returned to tank 102. A temperature controller (not shown in FIG. 2) provides for temperature control of the processing fluids. Temperature sensors (not shown) are implemented to monitor a temperature of processing fluids in a plurality of locations and states of substrate processing. In one embodiment, pumping of processing fluids is continuous during substrate processing. In another embodiment, processing fluids are pumped through the heater and filter according to a periodic schedule as desired. The periodic schedule can range from continuous pumping to any desired pumping cycle based on such processing conditions as processing fluid temperature, specific types of processing fluids, type of substrate being cleaned, stage of fabrication of the substrate, and any other processing parameter as appropriate.

Once substrate 110 has been processed in accordance with desired processing parameters of frequency, duration of processing, desired processing fluids, and the like, processing fluids are drained from tank 102. In one embodiment, processing fluids are pumped through a drain (see FIG. 10) to empty tank 102 to either a holding tank for recirculation or to waste. In one embodiment, tank 102 is then filled with DI water or other desired rinsing fluid or agent, and both active and backside surfaces of substrate 110 are rinsed by once again immersing substrate 110, and once again rotating substrate 110. In one embodiment, substrate is rotated at a high rate of rotation for the rinsing operation. After rinsing, in one embodiment, the rinse water or other rinsing agent is drained from tank 102. The processing fluids previously drained from tank 102 into a holding tank (not shown) are recirculated in the holding tank through the heater and the filter maintaining the temperature at a desired set point for continued substrate processing. Processing fluids are refreshed, recharged, and replaced as desired.

At the completion of processing, lid 104 is raised, separating from tank 102, and exposing substrate 110. A substrate handling robot, or other desired substrate handling device, attaches to substrate 110 and substrate stabilizing arm/wheel 114 retracts to an open position allowing substrate 110 to be removed from drive wheels 112.

In one embodiment, the megasonic processing as described is designed to provide non-contact substrate cleaning in one or both of processing chemicals and DI water. In addition to megasonic processing, embodiments of the present invention provide for substrate rinsing following megasonic processing. As described in greater detail below, one embodiment of the invention includes facilities connection for a plurality of processing chemicals, DI water, and further includes a recirculation system to filter and circulate processing chemicals, and to maintain processing fluids at a desired set temperature. In one embodiment, the range of temperature at which processing fluids are maintained and implemented in the present invention is from ambient temperature to approximately 140° C., with a typical operational temperature range of approximately 50° C. to approximately 90° C., depending upon the processing fluids, substrate to be cleaned, and the like.

Figure 3:
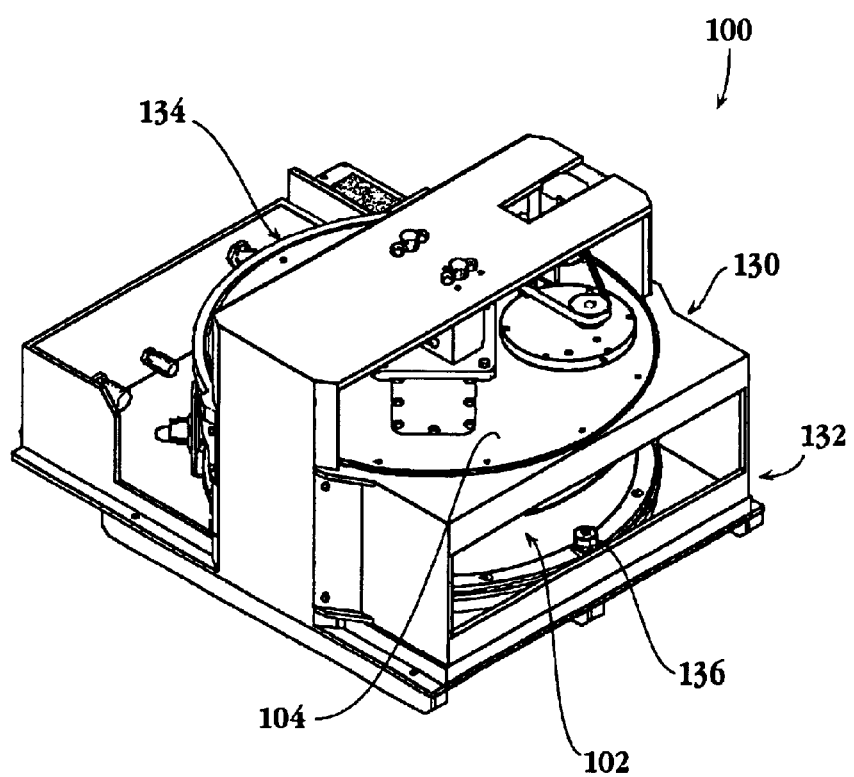
FIG. 3 shows a megasonic module in accordance with one embodiment of the present invention.

FIG. 3 shows a megasonic module 100 in accordance with one embodiment of the present invention. In the embodiment illustrated in FIG. 3, megasonic module 100 includes a megasonic module frame 130 to house and support tank 102, lid 104, and supporting structures, connections, and the like. Further, in one embodiment, megasonic module frame 130 configures megasonic module 100 to be readily implemented in existing substrate processing systems to replace or supplement configured brush box cleaning tools, prior art megasonic cleaning tools, other substrate cleaning or processing tools, and the like. In one embodiment, megasonic module frame 130 is constructed of Aluminum. In other embodiments, megasonic module frame 130 is constructed of any light weight, rigid, corrosion resistant material as desired.

As shown in FIG. 3, one embodiment of the present invention includes a rear enclosure 132. Rear enclosure 132 provides access to megasonic module 100 for insertion and extraction of a substrate 110 (not visible in FIG. 3). In one embodiment, when lid 104 is in a raised or open position, substrate 110 is inserted into megasonic module 100 for processing, or extracted from megasonic module 100 following processing, through rear enclosure 132. Opposite rear enclosure 132, front shield 134 shields the exposed processing environment when lid 104 is in a raised or open position.

In one embodiment, tank 102 is required to be in a level orientation, and at a desired height to receive substrates for processing. As described above, one embodiment of megasonic module frame 130 enables configuration of megasonic module 100 to existing processing tools. A plurality of height/level adjustments 136 are provided around a periphery base of tank 102 to ensure tank 102 is positioned in a level orientation, and at a proper height to allow for raising or opening and lowering or closing of lid 104 without obstruction or interference from megasonic module frame 130. In one embodiment, the level orientation is necessary not only for proper opening and closing of megasonic module 100, but tank 102 has a sloped base or floor to ensure adequate drainage, filtration, and the like. Level orientation is necessary in such an embodiment to maintain the necessary slope and orientation of the tank 102 base or floor.

Figure 4:
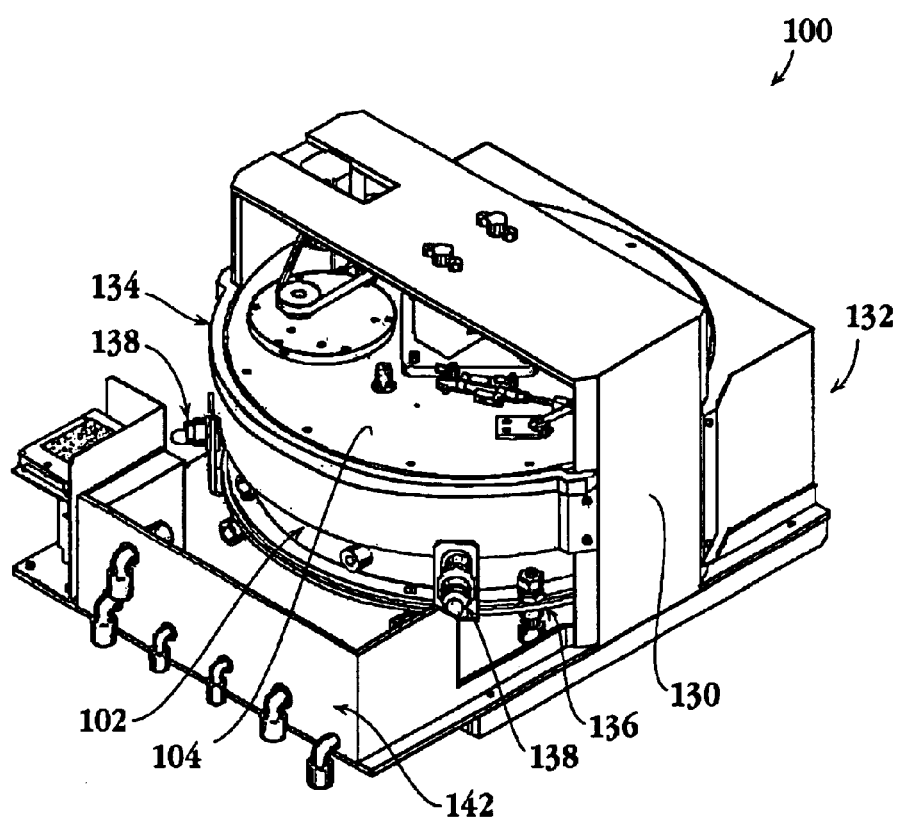
FIG. 4 is another view of megasonic module in accordance with an embodiment of the invention.

FIG. 4 is another view of megasonic module 100 in accordance with an embodiment of the invention. Megasonic module 100 is configured with megasonic module frame 130, and front shield 134 is visible shielding the processing environment and the side of tank 102. One of the plurality of height/level adjustments 136 is shown along base of tank 102. Lid 104 is shown level with top of front shield 134 indicating, in one embodiment, that lid 104 is in a full open or raised position. Access to insert or remove a substrate is not visible in FIG. 4, but is provided through rear enclosure 132.

Sensors 138 are shown along side of tank 102. In one embodiment, one or more sensors 138 are provided to sense fluid level within tank 102, and are used with megasonic module control (not shown) to determine processing fluid level for filling and draining tank 102, rinsing fluid level for filling and draining tank 102, and the like. Additionally, in one embodiment, at least one sensor is provided to determine presence and proper orientation of substrate 110 (not shown). In one embodiment, sensors 138 are optical sensors, and in other embodiments sensors 138 are of any type used to determine fluid level, substrate presence and orientation, and the like.

In one embodiment of the present invention, facilities connection 142 is provided for megasonic module 100 as shown in FIG. 4. Facilities connection 142 provides for plumbing a plurality of processing fluids, DI water, waste fluid, air, gases, and the like to and from megasonic module 100 as desired. As described above, megasonic module 100 is configurable to process substrates in a plurality of applications such as semiconductor wafer manufacturing, flat panel display fabrication, and the like. Facilities connection 142 provides for use of megasonic module 100 in such implementations as, by way of example, etch, CVD, and CMP cleaning operations at various stages of semiconductor wafer fabrication. Required processing fluids are process-dependent, and facilities connection 142 enables plumbing of a plurality of processing fluids as desired, as well as drainage for waste fluids. Further, facilities connection 142 enables easy exchange to replace existing cleaning tools, and easy integration with cluster tool processing systems.

Figure 5:
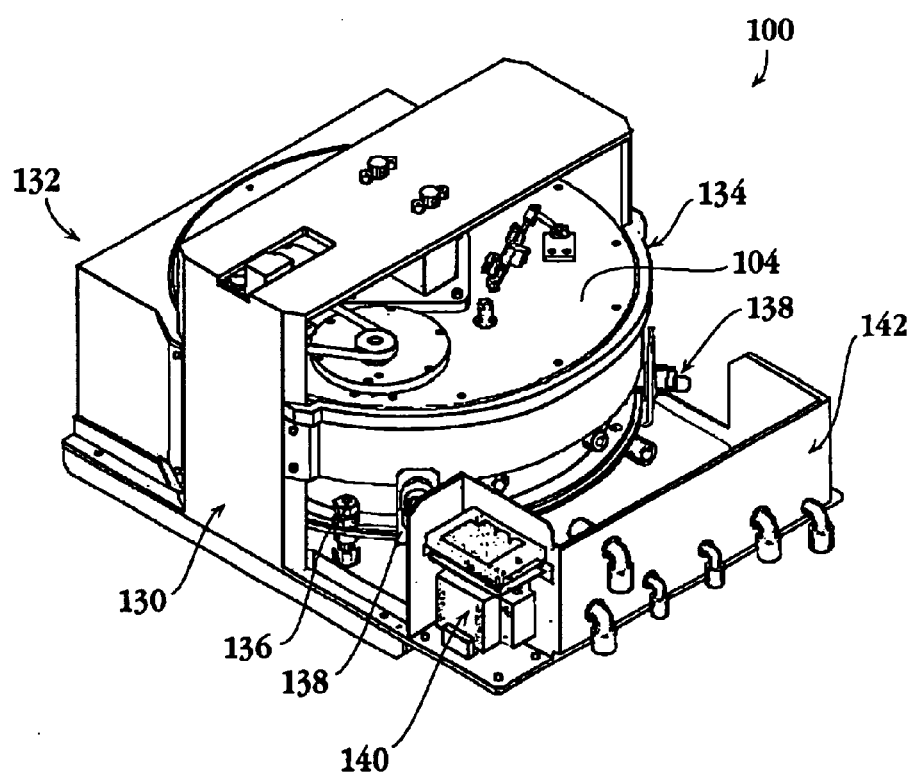
FIG. 5 shows another perspective view of a megasonic module in accordance with an embodiment of the invention.

FIG. 5 shows another perspective view of a megasonic module 100 in accordance with an embodiment of the invention. In FIG. 5, megasonic module 100 is configured in megasonic module frame 130. Tank 102 is behind front shield 134, and lid 104 is shown level with a top edge of front shield 134. Sensors 138 are shown at base of tank 102, as is height/level adjustment 136. Rear enclosure is not visible, but indicated at 132, and facilities connection is shown at 142. In one embodiment of the present invention, module control 140 is provided to control power, pneumatics, and fluid supply and drainage. In one embodiment, module control 140 provides system control and integration of the various megasonic module 100 operations such as, by way of example, opening and closing lid 104, securing substrate 110 against drive wheels 112 with substrate stabilizing arm/wheel 114 (see FIG. 2), filling tank 102 with processing fluid, energizing megasonic modules, rotating substrate, halting processing, draining tank 102, repeating operations for rinsing substrate, and all other such operations performed in substrate processing. Additionally, module control 140 provides responsive command in response to signals received from sensors 138 to initiate or halt filling tank 102 with processing fluids, enable substrate rotation or closing of lid 104 in response to a signal indicating presence of substrate, temperature control of processing fluids and the like.

Figure 6:
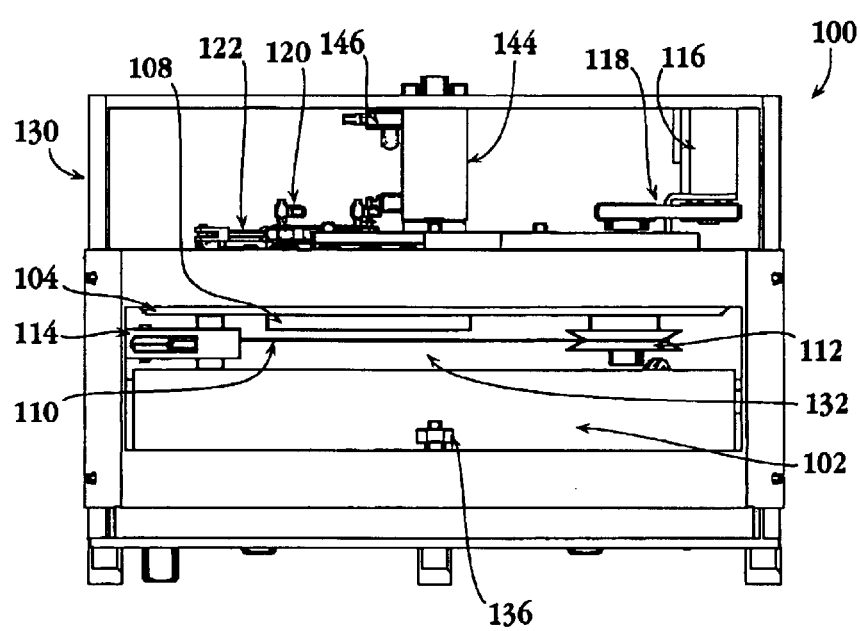
FIG. 6 is a plan view of a megasonic module looking into rear enclosure in accordance with an embodiment of the invention.

FIG. 6 is a plan view of a megasonic module 100 looking into rear enclosure 132 in accordance with an embodiment of the invention. Megasonic module 100 includes a megasonic module frame 114 defining, among other features, rear enclosure 132. In FIG. 6, lid 104 is in an open or raised position, and a substrate 110 is shown positioned against drive wheels 112 and substrate stabilizing arm/wheel 114. Above or over substrate 110 and attached to an underside of lid 104 is lid megasonic transducer 108. Below or under substrate 110 is tank 102 into which substrate will be lowered and submerged in processing fluids. At base of tank 102 is a level/height adjustment 136. Substrate stabilizing arm/wheel 114 is positioned with positioning rod 122 and air cylinder 120. In one embodiment, an actuator is used in place of an air cylinder and is pneumatically, hydraulically, or by use of a motor, actuated to move positioning rod 122 to operate substrate stabilizing arm/wheel 114.

In one embodiment, lid 104 is raised and lowered into "open" and "closed" positions with lid positioning mechanism 144. A lid positioning air cylinder/actuator 146 is provided which actuates lid positioning mechanism 144 to raise and lower lid. Drive motor 116 and drive belt 118 used for drive wheels 112 are also shown.

Figure 7:
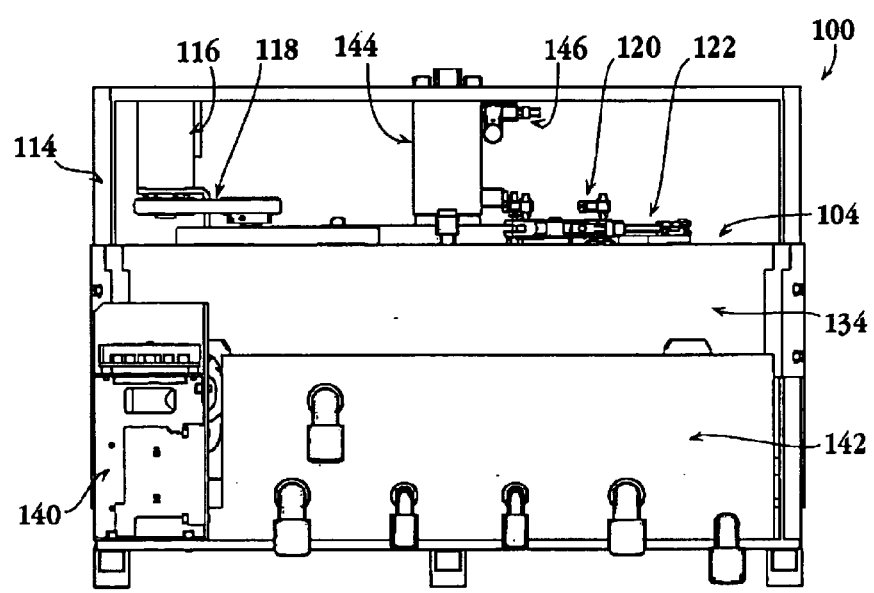
FIG. 7 is a plan view of a megasonic module looking at front shield and facilities connection in accordance with an embodiment of the invention.

FIG. 7 is a plan view of a megasonic module 100 looking at front shield 134 and facilities connection 142 in accordance with an embodiment of the invention. As shown in FIG. 7, the processing environment of the megasonic module 100 is shielded by front shield 134. In one embodiment facilities connection 142 provides a singular centralized location for connection of all facilities support such as, by way of example, processing fluid supply, air supply, power, waste drainage, and the like.

As described above in reference to FIG. 6, drive motor 116 and drive belt 118 are shown over lid 104, as well as lid positioning mechanism 144, lid positioning air cylinder/actuator 143, air cylinder 120, and positioning rod 122.

Figure 8:
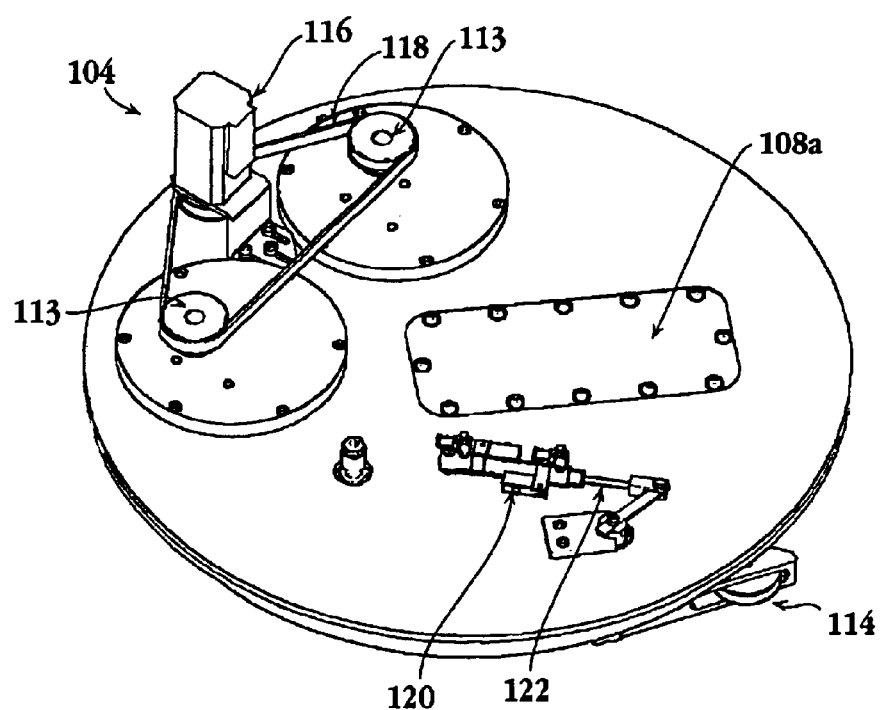
FIG. 8 shows a top view of the lid with associated component parts in accordance with one embodiment of the present invention.

FIG. 8 shows a top view of lid 104 with associated component parts in accordance with one embodiment of the present invention. Lid 104 includes air cylinder 120 and positioning rod 122 as described above. Lid megasonic transducer access plate 108a provides access and mounting for lid megasonic transducer 108 (not visible in FIG. 8) located on the under or interior surface of lid 104. Drive motor 116 is shown with drive belt 118. Drive wheel drive pulleys 113 are attached to drive wheels 112 (not visible in FIG. 8) located on the under or interior surface of lid 104. In one embodiment, drive motor 116 is configured to cause substrate rotation up to approximately 500 RPM. Operational substrate rotation is process dependent, but typical operational substrate rotation ranges from approximately one to eight RPM during megasonic processing, approximately 200–300 RPM during substrate rinsing, and nominal rotation (one to five RPM) during tank 102 filling and draining, if desired. Also located on the under or interior surface of lid 104 is substrate stabilizing arm/wheel 114.

In one embodiment, lid 104 is constructed of polyvinylidene fluoride (PVDF), and in other embodiments other materials that provide the desired qualities of being chemically resistant, light weight, rigid, and strong can be used. Typical materials, in addition to PVDF, include most fluoropolymers, PET, and the like. Chemical resistance is desired for any surface that will be exposed to processing fluids. Any supporting structures are constructed of aluminum or other similar material.

Figure 9:
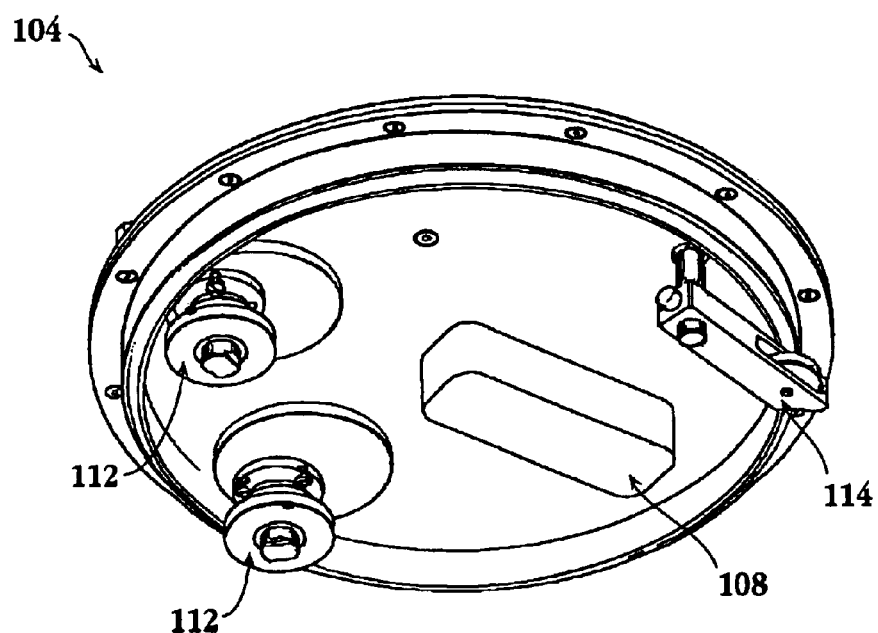
FIG. 9 shows an under or interior surface of the lid in accordance with an embodiment of the invention.

FIG. 9 shows an under or interior surface of lid 104 in accordance with an embodiment of the invention. Drive wheels 112 extend from the under or interior surface of lid 104, as does substrate stabilizing arm/wheel 114. In one embodiment, drive wheels 112 are configurable to receive and rotate a plurality of substrate sizes. Lid 104 includes a plurality of mounting positions for drive wheels, and an appropriate size drive belt 118 is selected depending on drive wheel 112 configuration. In one embodiment, drive wheels 112 are easily and rapidly configurable for processing 200 mm and 300 mm semiconductor wafers, and in other embodiments are configurable to other substrate sizes as desired.

Lid megasonic transducer 108 is shown attached to lid 104. In one embodiment, lid 104 is configured to mate with tank 102 (not shown in FIG. 9) to define a processing environment. Lid megasonic transducer 108 is configured to direct megasonic energy to a surface of a substrate that is positioned in drive wheels 112 and secured by substrate stabilizing arm/wheel 114. During processing, tank megasonic transducer 106 (see FIG. 2) directs megasonic energy to an opposite surface of substrate as lid megasonic transducer 108, thereby effecting simultaneous dual-sided megasonic processing of a substrate. Drive wheels 112 rotate substrate during processing to ensure uniform and thorough megasonic processing of both an active and a backside surface of a substrate. In one embodiment, drive wheels 112 are constructed of high speed, engineered elastomers such as Hytrel®, commercially available from DuPont™. Other materials include polyurethane, and any of a plurality of polyamide-imides with desirable qualities of strength, heat resistance, corrosion resistance, light weight, and the like.

Figure 10:
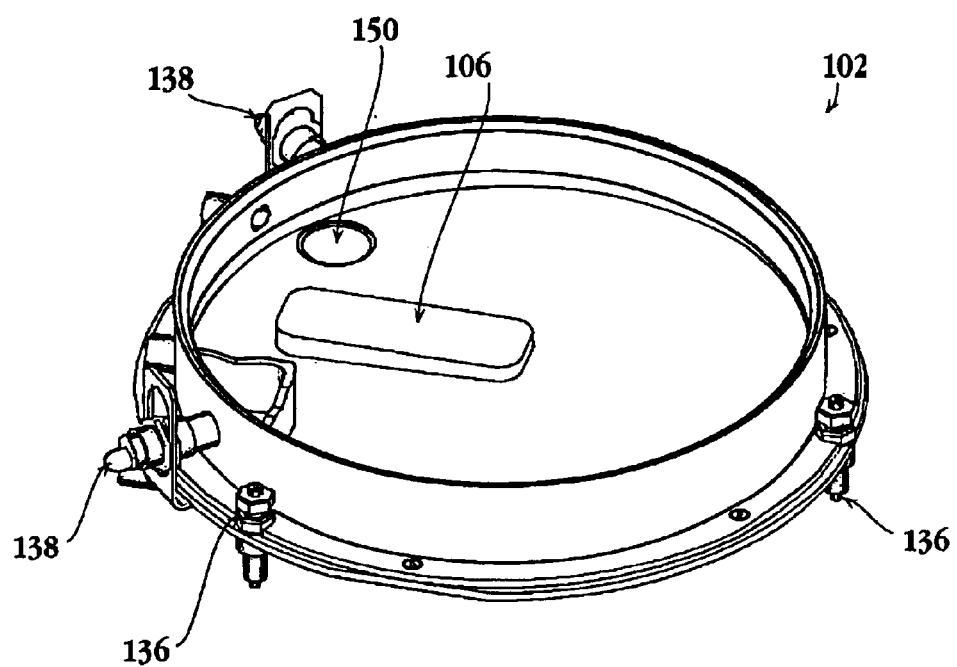
FIG. 10 shows the tank in accordance with one embodiment of the present invention.

FIG. 10 shows tank 102 in accordance with one embodiment of the present invention. Tank 102 is configured to mate with lid 104 as described above in reference to FIGS. 8 and 9 and, in one embodiment, is constructed of PVDF and designed to hold a volume of processing fluid sufficient to submerge a substrate for processing therein. In other embodiments, fluoropolymers, PET, and any such material exhibiting desirable qualities such as chemical resistance, strength, easy to fabricate, light weight, and the like are used to construct tank 102.

As shown in FIG. 10, tank 102 includes drain with screen 150 and overflow 152. Drain with screen 150 is configured for use to drain and filter processing fluid or rinse fluid from tank 102. Additionally, drain with screen 150 is configured for processing fluid recirculation. In one embodiment, processing fluid is continuously or periodically circulated through drain with screen 150 in order to maintain a desired degree or standard of cleanliness of processing fluid as desired. In one embodiment, a holding tank (not pictured) is included in a processing fluid system (not pictured) for megasonic module 100 (see FIG. 1). In one embodiment including a recirculation system, a fluid volume ranges from approximately 1.25 gallons to approximately 1.75 gallons allowing for approximately one volume turn-over for each substrate processed.

In one embodiment, overflow 152 is provided to drain off excessive processing fluid or rinse fluid and prevent damage to tank 102, lid 104, any seals (not shown), and any other supporting components.

FIG. 10 further shows height/level adjustments 136 around the periphery base of tank 102. As described above in reference to FIG. 3, embodiments of the present invention include a plurality of height/level adjustments 136 to ensure and maintain desired orientation and positioning of megasonic module 100. In one embodiment, floor of tank 102 is sloped at an approximately 2% grade or slope. In order to maintain a desired fluid level, desired slope of tank 102, desired drainage, and desired wafer orientation during processing, height/level adjustments 136 are used to level tank 102 in a desired position. Further, sensors 138 are provided in embodiments of the present invention to monitor such conditions as fluid level, presence or absence of a substrate, fluid flow, and the like. In one embodiment, sensors 138 are optical sensors, and in other embodiments, sensors 138 are of any desired known sensor technology appropriate for sensing the desired condition.

FIG. 10 also shows tank megasonic transducer 106 configured to a floor of tank 102. As described above in reference to FIG. 9, embodiments of the present invention provide for simultaneous megasonic processing of both an active surface and a backside surface of a substrate such as a semiconductor wafer. Tank megasonic transducer 106 directs megasonic energy to one surface of a substrate being processed while lid megasonic transducer 108 (see FIG. 9) directs megasonic energy to the opposite surface of the substrate, thereby effecting dual-sided megasonic processing. In one embodiment, tank megasonic transducer 106 and lid megasonic transducer 108 are connected to a multiplexing generator (not shown) energizing transducers 106, 108 to enable megasonic transmission in a range from approximately 5 W/inch$^2$ to approximately 165 W/inch$^2$ at approximately 0.7 MHz to approximately 1.3 MHz.

Figure 11:
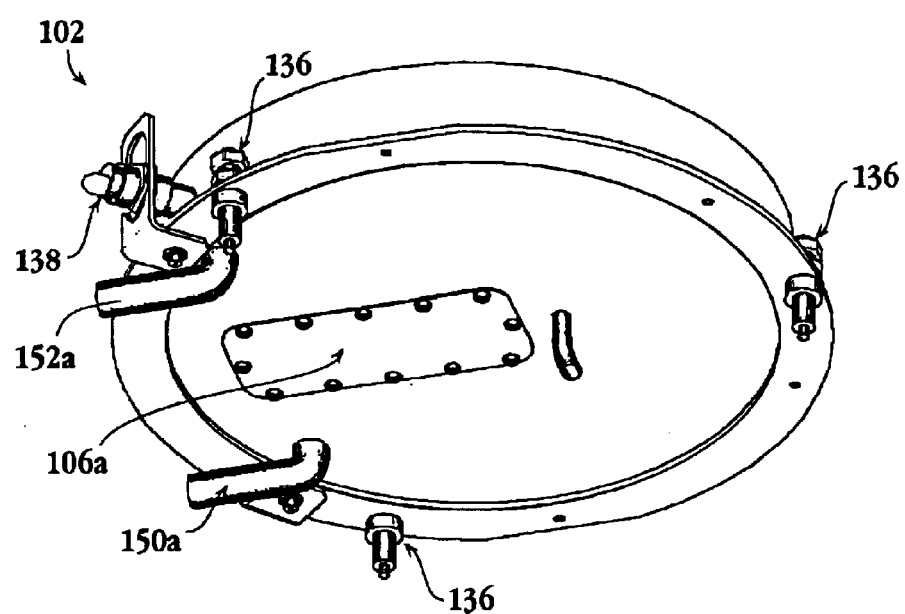
FIG. 11 shows a bottom or under surface of the tank in accordance with one embodiment of the invention.

FIG. 11 shows a bottom or under surface of tank 102 in accordance with one embodiment of the invention. Height/level adjustments 136 are provided around a periphery of the base of tank 102, and sensor 138 is shown. In the illustrated embodiment, overflow drain 152a is shown extending from overflow 152 (see FIG. 10), and drain pipe 150a is shown extending from drain with screen 150 (see FIG. 10). In one embodiment, overflow drain 152a and drain pipe 150a flow from the bottom of tank 102 to facilities connection 142 (see FIG. 4) for centralized connection with a plurality of facilities supply and drain connections.

Also illustrated in FIG. 11 is tank megasonic transducer access plate 106a. In one embodiment, the tank megasonic transducer access plate 106a provides access and mounting for tank megasonic transducer 106 (not visible in FIG. 11) located inside tank 102.

Figure 12:
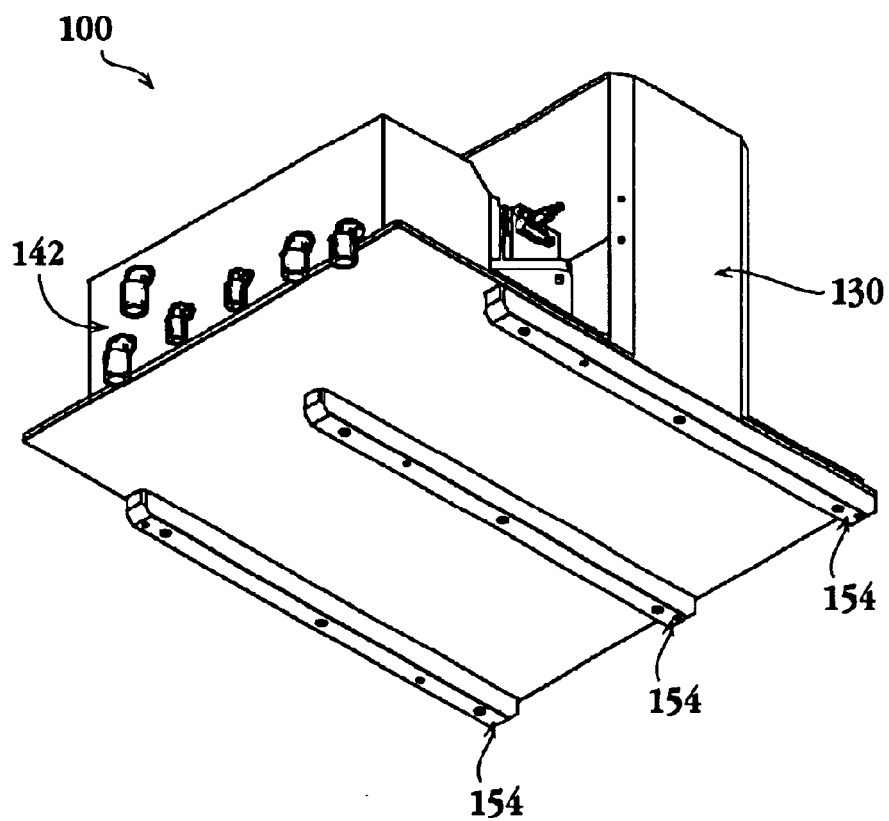
FIG. 12 shows a view of megasonic module from below in accordance with one embodiment of the present invention.

FIG. 12 shows a view of megasonic module 100 from below in accordance with one embodiment of the present invention. In the embodiment illustrated in FIG. 12, megasonic module 100 is configured with megasonic module frame 130. In accordance with one embodiment, the megasonic module frame 130 in FIG. 12 provides a closed solid surface across the bottom of megasonic module 100. As described in detail above, one embodiment of megasonic module is readily configurable to integrated processing systems, and skids 154 are provided to enable easy installation and removal from an integrated processing system. In one embodiment, skids 154 are constructed of PET, and in other embodiments, skids 154 are constructed of any similar material that is light weight, durable, easily fabricated, corrosion resistant, and provides a surface that easily slides into and out of integrated systems into which megasonic module 100 is configured.

Figure 13:
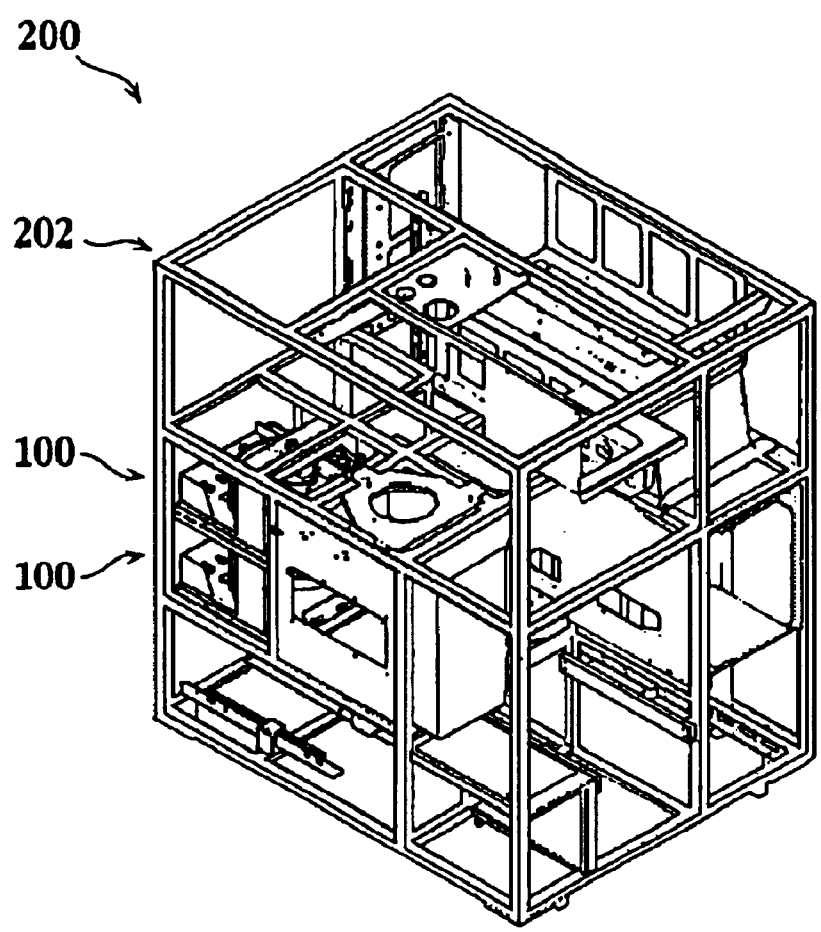
FIG. 13 shows an integrated substrate processing system in accordance with one embodiment of the present invention.

FIG. 13 shows an integrated substrate processing system 200 in accordance with one embodiment of the present invention. Integrated substrate processing system 200, includes a system frame 202 to support a system enclosure (not shown), and to house and support a plurality of substrate processing tools. In other embodiments, a plurality of processing tools are clustered together, typically called cluster tools, for efficient, multiple-process fabrication. A cluster tool can be within a single system frame 202, or in larger embodiments, one or more integrated processing systems 200 are clustered together in a cluster tool arrangement. Examples of processing tools clustered to configure an integrated processing system 200 include processing chambers such as etch, plasma etch, Chemical Vapor Deposition (CVD), and the like, substrate transfer systems, substrate cleaning tools such as brush box scrubbers, megasonic processing tools, and the like, chemical mechanical planarization (CMP) tools, substrate rinsing and drying tools, and any other substrate processing tool as desired to efficiently cluster multiple substrate processing operations into integrated systems. In FIG. 13, two megasonic modules 100 are identified in exemplary locations of integrated substrate processing system 200. In other embodiments, one or more megasonic modules 100 are positioned in any location of an integrated substrate processing system as desired. In one embodiment, necessary facilities such as power, processing chemicals and other fluids, processing gasses, drainage, exhaust, and any desired facilities support for a plurality of processing tools are provided and supported by the integrated substrate processing system 200.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A megasonic module for substrate processing, the megasonic module comprising:

a substrate processing tank configured to hold processing fluids in which the substrate is submerged;

a lid configured to mate with and seal the substrate processing tank;

at least two megasonic transducers positioned within the megasonic module;

at least one drive wheel configured to receive an edge of the substrate to support and rotate the substrate;

a drive motor configured to rotate the at least one drive wheel; and a stabilizing arm/wheel configured to support the substrate against the at least one drive wheel, and to allow the rotation of the substrate while supported against the at least one drive wheel, wherein the at least one drive wheel and the stabilizing arm/wheel are attached to the lid.

2. The megasonic module of claim 1, wherein the substrate is supported and rotated in a horizontal orientation.

3. The megasonic module of claim 1, wherein the drive motor is configured to rotate the at least one drive wheel and cause the substrate to rotate at a rate of from about 1 to about 500 revolutions per minute.

4. The megasonic module of claim 1, wherein each of the at least two megasonic transducers is configured for megasonic transmission in a range of about 5 W/inch$^2$ to about 165 W/inch$^2$.

5. The megasonic module of claim 1, wherein the at least two megasonic transducers are positioned to direct megasonic energy to each of an active surface and a backside surface of the substrate the at least two megasonic transducers being capable of directing megasonic energy to each of the active surface and the backside surface of the substrate simultaneously during substrate processing.

6. The megasonic module of claim 1, further comprising a holding tank, wherein the holding tank is configured to serve as a reservoir for the megasonic module to enable drainage of processing fluids from the substrate processing tank and to enable recirculation of fluids through the megasonic module.

7. The megasonic module of claim 1, further comprising a temperature controller configured to maintain a temperature of the processing fluids at a temperature set point.

8. The megasonic module of claim 1, further comprising two drive wheels.

* * * * *